US006872606B2

(12) United States Patent
Chen et al.

(10) Patent No.: US 6,872,606 B2
(45) Date of Patent: Mar. 29, 2005

(54) SEMICONDUCTOR DEVICE WITH RAISED SEGMENT

(75) Inventors: Hao-Yu Chen, Hsin-Chu (TW); Yee-Chia Yeo, Hsin-Chu (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 10/406,403

(22) Filed: Apr. 3, 2003

(65) Prior Publication Data

US 2004/0197969 A1 Oct. 7, 2004

(51) Int. Cl.[7] ............................................. H01L 21/336
(52) U.S. Cl. .................................... 438/164; 438/300
(58) Field of Search ................................. 438/164, 300, 438/FOR 201; 257/E21.43

(56) References Cited

U.S. PATENT DOCUMENTS

| 6,200,867 | B1 | | 3/2001 | Chen |
| 6,218,711 | B1 | | 4/2001 | Yu |
| 6,291,310 | B1 | * | 9/2001 | Madson et al. ............. 438/424 |
| 6,391,796 | B1 | | 5/2002 | Akiyama et al. |
| 6,406,951 | B1 | | 6/2002 | Yu |
| 6,429,084 | B1 | | 8/2002 | Park et al. |
| 2004/0150042 | A1 | * | 8/2004 | Yeo et al. ................... 257/347 |

OTHER PUBLICATIONS

V. Subramanian, et al., "A Bulk–Si–Compatible Ultrathin–Body SOI Technology for Sub–100nm MOSFETs," Device Research Conference, Jun. 1999, pp. 28–29.

Y.–K. Choi, et al., "Ultra–Thin Body PMOSFETs with Selectively Deposited Ge Source/Drain," 2001 Symposium on VLSI Technology, Digest of Technical Papers, pp. 19–20.

Y.–K. Choi, et al., "30nm Ultra–Thin–Body SOI MOSFET with Selectively Deposited Ge Raised S/D," Device Research Conference, Jun. 2000, pp. 23–24, Denver, CO.

R. Chau, et al., "A 50nm Depleted–Substrate CMOS Transistor (DST)," International Electron Device Meeting 2001, Technical Digest, pp. 621–624.

Y.–K. Choi, et al., "Ultrathin–Body SOI MOSFET for Deep–Sub–Tenth Micron Era," IEEE Electron Device Letters, May 2000, pp. 254–255, vol. 21, No. 5.

N. Sato, et al., "Hydrogen Annealed Silicon–On–Insulator," Applied Physics Letters, Oct. 1994, pp. 1924–1926, vol. 65, No. 15.

K. Yamagata, et al., "Selective Growth Of Si Crystals from the Aggolmerated Si Seeds Over Amorphous Substrates," Applied Physics Letters, pp. 2557–2559, Nov. 1992, Vol. 61, No. 21.

S. Wolf, et al., "Silicon Processing for the VLSI Era", pp. 256–261, vol. 1: Process Technology, Lattice Press, Sunset Beach, CA.

* cited by examiner

Primary Examiner—George Fourson
(74) Attorney, Agent, or Firm—Slater & Matsil, L.L.P.

(57) ABSTRACT

A device having a raised segment, and a manufacturing method for same. An SOI wafer is provided having a substrate, an insulating layer disposed over the substrate, and a layer of semiconductor material disposed over the insulating layer. The semiconductor material is patterned to form a mesa structure. The wafer is annealed to form a raised segment on the mesa structure.

40 Claims, 6 Drawing Sheets

SEMICONDUCTOR DEVICE WITH RAISED SEGMENT

TECHNICAL FIELD

The present invention relates generally to the field of semiconductor devices, and more specifically to the fabrication of field effect transistors with raised or elevated source and drain structures.

BACKGROUND

Integrated circuits comprising semiconductor devices are used in many electronic applications, such as computers, televisions, cellular phones and other electronic devices. Integrated circuits are continually being designed in smaller dimensions, based on the demand for smaller consumer products and increased speed. Improved yields may also be achieved by reducing the area of an integrated circuit die.

A common component of an integrated circuit is a metal oxide semiconductor field effect transistor (MOSFET). As the gate length of MOSFET devices is scaled down into the sub-100 nm regime for improved performance and density, the requirements for body-doping concentration, gate oxide thickness, and source/drain doping profiles to control short-channel effects become increasingly difficult to meet when conventional semiconductor device structures based on bulk silicon (Si) substrates are utilized.

A prior art MOSFET device 100 is shown in FIG. 1a. The device 100 comprises a substrate 102 having a source 104 and drain 106 formed therein. The source 104 and drain 106 are typically formed by implanting or diffusing dopants into the semiconductor substrate 102. A gate dielectric 108 is deposited over the substrate 102, and a gate electrode 110 is formed over the gate dielectric 108. A spacer 112 is disposed adjacent each side of the gate electrode 110. A sub-surface leakage path or channel 114 resides beneath the gate electrode 110, where current is adapted to flow from the source 104 to the drain 106, for example, when the MOSFET 100 is activated.

Heavy channel 114 doping is required to provide adequate suppression of short-channel effects, which results in degraded mobility and enhanced junction leakage. The aggressive reduction of the $SiO_2$ gate dielectric 108 thickness for reduced short-channel effects and improved drive current leads to increased direct tunneling gate leakage current and standby power consumption, and also raises concerns regarding the gate dielectric 108 reliability. For device scaling well into the sub-100 nm regime, a promising approach to controlling short-channel effects is to use an ultra-thin silicon film as the MOSFET channel 114 so that sub-surface leakage paths are eliminated.

A device structure that implements this concept is referred to as an ultra-thin body (UTB) MOSFET 200, shown in FIG. 1b. In a UTB MOSFET 200, a silicon-on-insulator (SOI) wafer is often used, comprising a substrate 202, an insulator 216 and a thin semiconductor material 218. The substrate 202 comprises a semiconductor material, and the insulator 216 is disposed over the substrate 202. The insulator 216 may comprise a buried oxide with a thickness in the range of 40 nm to 500 nm, for example. A thin film of semiconductor material 218, also referred to as a silicon body, is formed over the insulator 216. The thin semiconductor material 218 may comprise silicon with a thickness of 50 mm (or 500 Angstroms) or less, for example.

In a UTB MOSFET device 200, the source 204 to drain 206 current is restricted to flow in a region (e.g., channel 214) close to the gate electrode 210, which provides improved gate electrode 210 control. The silicon body 218 thickness $t_{Si}$ is typically kept below a third of the gate electrode 210 length (e.g., the horizontal length of gate electrode 210 in FIG. 1b). Because the UTB MOSFET device 200 does not rely on a heavily-doped channel 214 for the suppression of short-channel effects, the problems of mobility degradation due to impurity scattering, and threshold voltage $V_{TH}$ fluctuation due to the random variation of the number of dopant atoms in the channel regions of nano-scale transistors, are avoided. However, if ultra-thin source/drain regions 204 and 206 are used for the UTB MOSFET device 200, a high series resistance results that degrades the drive current. To avoid this series resistance problem, a raised source and drain structure 222 (also known in the art as an elevated source and drain structure), shown in FIG. 1c, is sometimes used. A raised or elevated source and drain device includes raised structures 222 having a thickness $t_{S/D}$ that are formed over the source 204 and drain 206.

There are several prior art methods of forming a raised source and drain structure 222 after the gate electrode 210 patterning step. One method includes forming raised source/drain regions 222 by poly-Si deposition followed by an etch-back process. Another method includes forming the raised source/drain structures 222 by the selective deposition of Germanium (Ge) on the source 204 and drain 206 regions. Yet another approach is to form the raised source/drain regions 222 by selective SiGe epitaxy, or by selective epitaxial growth of silicon. Another approach involves sputtering silicon over the source 204 and drain 206 regions after the gate electrode 210 and spacer 212 structures are formed. However, selective epitaxial growth of the raised source and drain regions 222 is costly, and the epitaxial growth is highly dependent on the pattern density.

What is needed in the art is an improved, cost-saving method for forming raised source and drain regions or structures of a MOSFET device.

SUMMARY OF THE INVENTION

These and other problems are generally solved or circumvented, and technical advantages are generally achieved, by preferred embodiments of the present invention, which provide a novel method of forming raised segments by annealing a semiconductor material.

In accordance with a preferred embodiment of the present invention, a transistor includes a semiconductor layer overlying an insulator, and a gate dielectric disposed over a portion of the semiconductor layer, the gate dielectric having a top surface. A gate electrode is disposed over the gate dielectric, the gate electrode comprising a first side and a second side opposite the first side. A raised source region is formed over a portion of the semiconductor layer adjacent the first side of the gate electrode, and a raised drain region is formed over a portion of the semiconductor layer adjacent the second side of the gate electrode. The raised source region and the raised drain region have a height greater than and extend above the top surface of the gate dielectric. The raised source region and drain region comprise non-planar top surfaces.

In accordance with another preferred embodiment of the present invention, a method of forming a semiconductor device includes providing a wafer, the wafer comprising a layer of semiconductor material disposed over an insulating layer, and patterning the semiconductor material to form a mesa structure. The semiconductor device is formed within at least a portion of the mesa structure, leaving a portion of the semiconductor material of the mesa structure exposed. The mesa structure is then annealed at an elevated temperature to form at least one raised segment on the exposed semiconductor material of the mesa structure.

In accordance with yet another preferred embodiment of the present invention, a method of forming a semiconductor device includes providing a wafer, the wafer comprising a layer of semiconductor material disposed over an insulating layer, patterning the semiconductor material to form a mesa structure, and forming a gate dielectric over a portion of the mesa structure. The method includes forming a gate electrode over the gate dielectric, the gate electrode comprising two or more sides, forming spacers adjacent the sides of the gate electrode, and annealing the mesa structure at an elevated temperature to form raised segments on the mesa structure adjacent the spacers.

An advantage of a preferred embodiment of the present invention is providing an inexpensive method of forming raised structures over a semiconductor material, which is particularly advantageous in a MOSFET device formed on an SOI wafer or in a UTB application. Advantageously, a deposition or epitaxial growth step is not required; the raised structures are formed by heating the wafer.

Another advantage of embodiments of the present invention is that a wide process window is provided for forming a raised source and drain structure. In particular, embodiments of the invention allow a raised source and drain structure to be formed with ease, even when the thickness of the silicon body is extremely thin, e.g. less than 100 Angstroms. For example, in prior art methods of forming a raised source and drain structure using epitaxial techniques, it is extremely difficult to grow a semiconductor material selectively on a semiconductor region with a very small thickness.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described herein with respect to preferred embodiments in a specific context, namely a MOSFET device formed within an SOI wafer. Embodiments of the invention may also be applied, however, to other transistors and semiconductor devices, as examples. The method described herein is not restricted to the formation of a raised source and drain region of a semiconductor device; the method may alternatively be used to form a raised segment of any semiconductor device, wherein the raised segment may be a part of a semiconductor device other than the source and drain.

Furthermore, the embodiments of the invention described herein are not restricted to the application of silicon-on-insulator ultra-thin body devices. Embodiments of the present invention have useful application in forming raised segments or regions in any semiconductor material, such as silicon, germanium, silicon-germanium, or compound semiconductors such as gallium arsenide, and indium phosphide overlying an insulator material, as examples. These semiconductor materials described herein may be in the crystalline or amorphous forms, as examples. The insulator material may comprise, but is not restricted to, silicon oxide, silicon nitride, or aluminum oxide, as examples. In a preferred embodiment, the semiconductor material comprises silicon, and the insulator comprises silicon oxide.

In ultra-thin body devices, a raised source and drain structure facilitates the formation of a subsequently formed self-aligned silicide (salicide) and reduces the high parasitic series resistance. Reduction of parasitic resistances in thin-body devices leads to a higher current drive and therefore better speed performance, or reduced power consumption for a given speed performance.

Figure 1A:
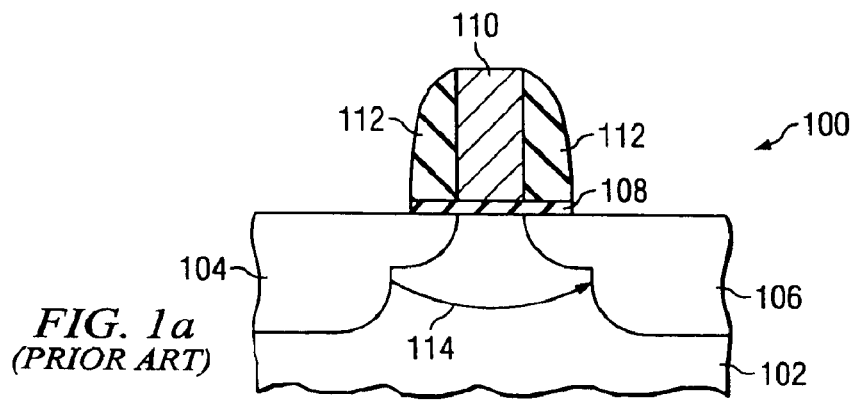
FIG. 1a illustrates a cross-sectional view of a prior art MOSFET device.
Figure 1B:
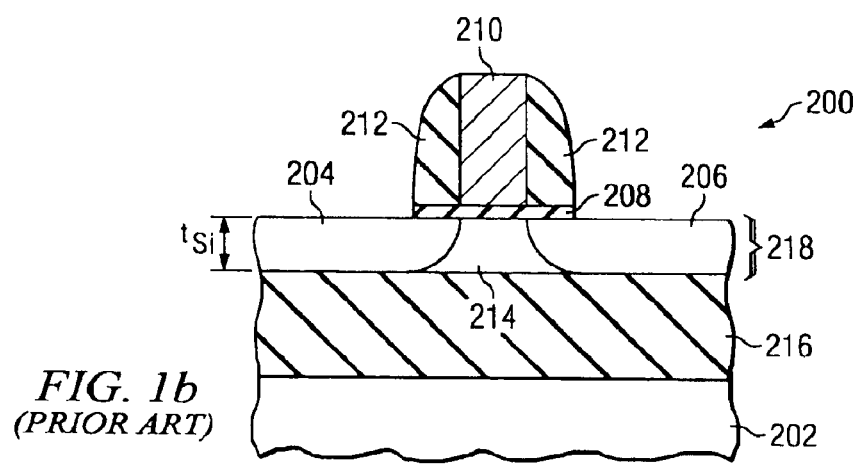
FIG. 1b shows a prior art MOSFET device having source and drain regions formed in an ultra-thin body.
Figure 1C:
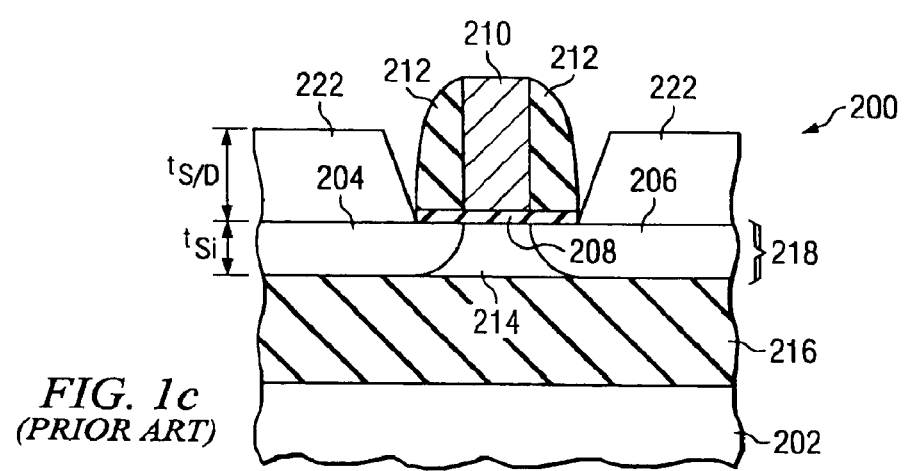
FIG. 1c shows a prior art MOSFET device having raised source and drain regions formed by deposition or epitaxial growth methods.
Figure 1D:
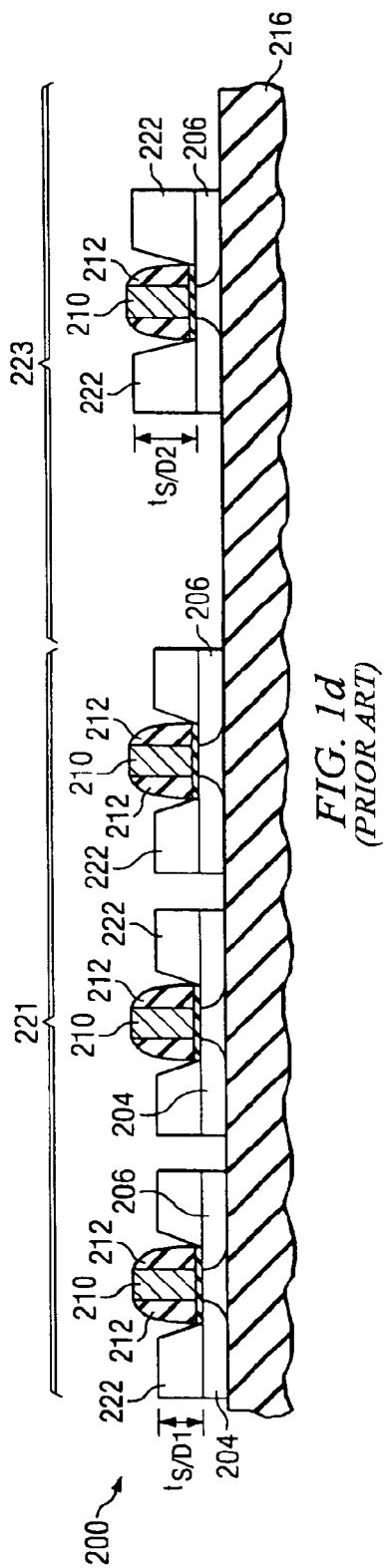
FIG. 1d illustrates non-uniformity in the raised source and drain region thickness that can occur when using epitaxial growth methods.

The most common method in the prior art for forming raised source and drain structures utilizes selective epitaxial growth of the source and drain regions. The rate of selective epitaxial growth is usually dependent on the pattern density, leading to problems related to non-uniform source and drain elevations $t_{S/D1}$ and $t_{S/D1}$, as shown in FIG. 1d. On a semiconductor wafer 200, there may be a first region 221 with a high pattern density and a second region 223 with a low pattern density. For example, first region 221 with a high pattern density includes many transistors positioned in close proximity to one another, whereas second region 223 with a low pattern density has fewer transistors spaced apart from one another. The thickness $t_{S/D1}$ of a raised structure 222 formed in the first region 221 and the thickness $t_{S/D2}$ of a raised structure 222 formed in the second region 223 may be different. For example, as illustrated in FIG. 1d, the thickness $t_{S/D2}$ of a raised structure 222 in the second region 223 may be greater than thickness $t_{S/D1}$ of a raised structure 222 in the first region 221. This is undesirable because the transistors in the first region 221 will have different properties than transistors in the second region 223.

Moreover, selective epitaxy is an expensive process with low throughput. In addition, selectively growing a silicon raised source and drain 222 on a thin silicon layer 218 can result in the thin silicon layer 218 being removed during the selective epitaxy process. This may occur because selective epitaxy of silicon typically employs an additional component such as hydrogen chloride in the reactant gas. The hydrogen chloride facilitates the etching of silicon 218 as it grows. It is this etch and growth mechanism that enables epitaxy with a high selectivity. However, if the starting silicon film thickness $t_{Si}$ (see FIG. 1c) is too thin, e.g. less than 100 Angstroms, the silicon in the source and drain regions 204/206 may be removed before any substantial epitaxial growth occurs, and the underlying insulator 216 may then be left exposed. This is problematic, because epitaxial growth of the raised source and drain regions 222 cannot proceed if the starting silicon layer 204 and 206 is completely removed.

In embodiments of the present invention, a novel process is described for the formation of raised source and drain structures, by annealing the wafer to form the raised structures. The raised source and drain regions of embodiments of the present invention are formed by rearrangement of silicon atoms in the original source and drain regions during the anneal step. The rearrangement of the silicon atoms may occur by surface migration of silicon atoms, for example. Therefore, embodiments of the present invention are applicable and advantageous for use with very thin silicon film thicknesses.

A method of forming at least one raised segment in a semiconductor device using the phenomenon of surface migration of semiconductor atoms on a semiconductor on insulator substrate in accordance with embodiments of the present invention will next be described. Using a specific example, the manufacturing of a silicon field effect transistor 332 (see FIG. 2e) will be described herein, wherein the source and drain regions include the raised segments 328 and 329.

Figure 2A:
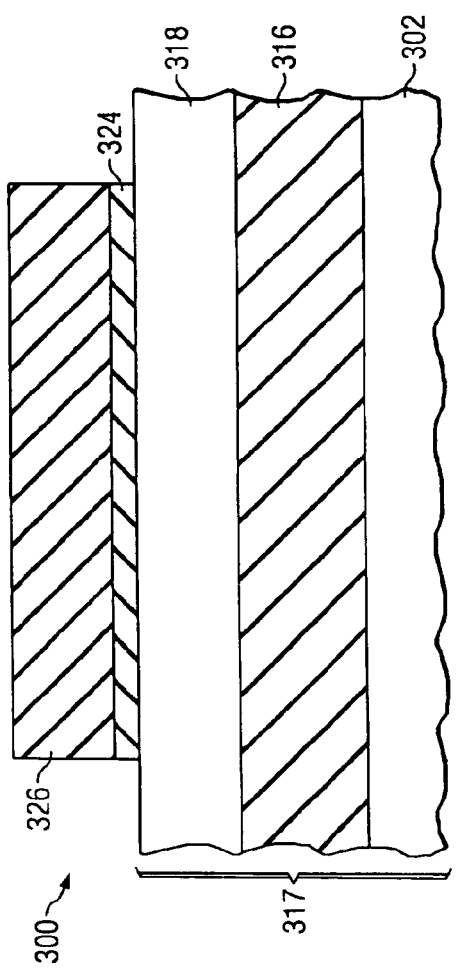
FIGS. 2a through 2e show cross-sectional views of a MOSFET device at various stages of manufacturing in accordance with an embodiment of the invention, wherein the MOSFET device includes raised source and drain regions formed after doping the underlying source and drain regions, and wherein the raised source and drain regions have a top surface that is multi-faceted.

FIGS. 2a through 2e illustrate a semiconductor device 300 fabrication process in accordance with an embodiment of the present invention. In this embodiment, the raised segments 328 and 329 are formed after the underlying source and drain regions 304 and 306 are doped. FIG. 2a shows a mask 326/324 that has been formed on the silicon-on-insulator (SOI) substrate 317. The SOI substrate 317 may include a substrate 302, insulator 316 comprised of a buried oxide, for example, formed over the substrate 302, and a semiconductor material 318 formed over the buried oxide 316. The semiconductor material 318 may comprise for example, a silicon film in a thickness of 300 Angstroms or less, and preferably, in a thickness of 100 Angstroms or less, as examples. The semiconductor material 318 may alternatively comprise other semiconductive materials and thicknesses. The mask 326/324 may comprise a silicon nitride layer 326 overlying a pad silicon oxide 324 layer, although the mask 326/324 may alternatively comprise a resist or other mask materials, as examples.

Figure 2B:
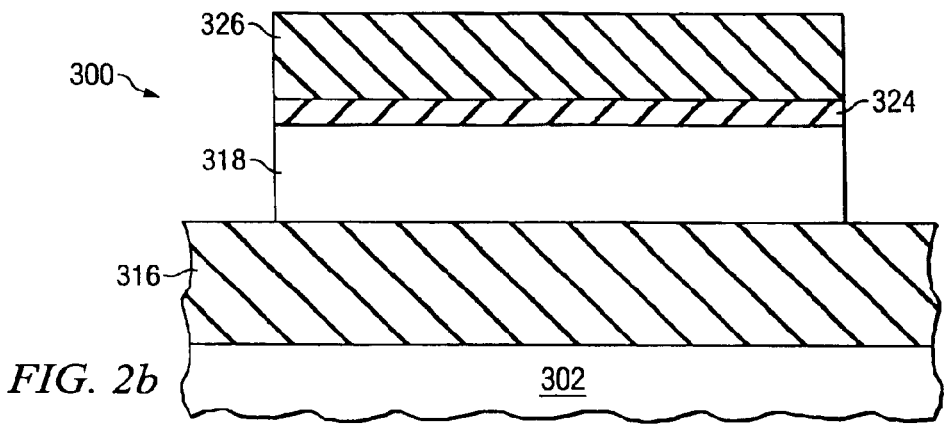

The silicon film 318 is etched using etching techniques known in the art, such as dry plasma etch, giving the cross-section as shown in FIG. 2b. The silicon film 318 shape after the etch step may comprise a mesa structure 319, (see FIG. 2c) being substantially square or rectangular in shape, for example.

Figure 2C:
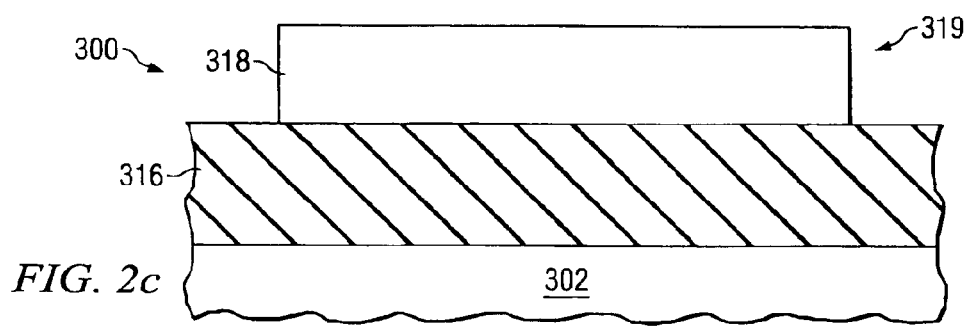
Figure 2D:
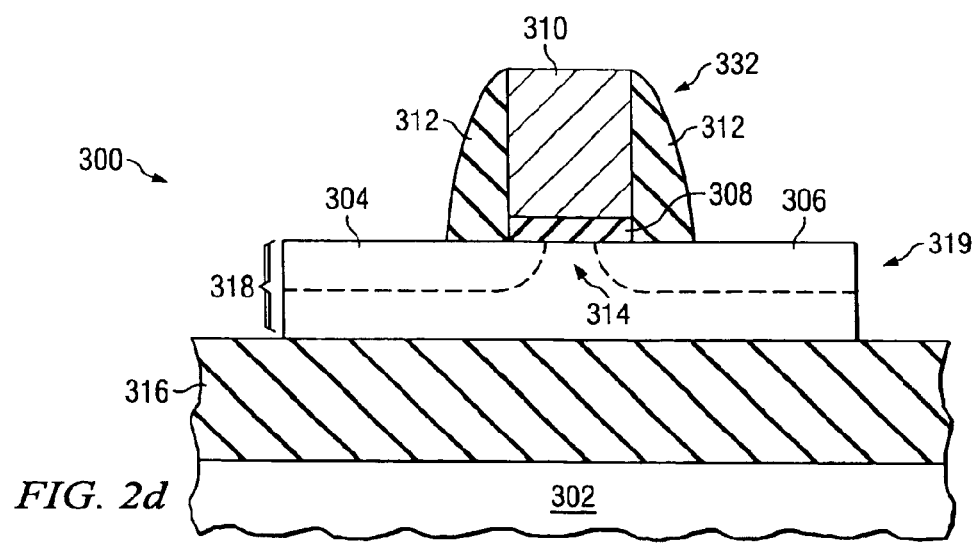

The active region mask 326/324 is removed, as shown in FIG. 2c. This is followed by a transistor 332 formation step, which may include body doping and threshold-voltage adjust implantation, gate dielectric 308 formation, gate electrode 310 formation, and doping of the source 304 and drain regions 306, leaving the cross-section shown in FIG. 2d. The gate dielectric 308 may comprise a conventional silicon oxide ($SiO_2$) gate dielectric, a silicon oxynitride gate dielectric ($SiO_xN_y$) or other insulating materials, as examples. Alternatively, the gate dielectric 308 may also comprise a high permittivity material such as hafnium oxide ($HfO_2$ or $Hf_xO_y$), hafnium oxynitride (HfON), hafnium silicate ($HfSiO_4$) zirconium oxide ($ZrO_2$), zirconium silicate ($ZrSiO_4$) aluminum oxide ($Al_2O_3$), or lanthanum oxide ($La_2O_3$) as examples. The gate dielectric chemistry may comprise other stoichiometric ratios than the ones listed herein, for example. The gate electrode 310 may be comprised of a semiconductor material such as poly-silicon or poly-silicon-germanium, as examples. The gate electrode 310 may alternatively comprise a conductor or metal, such as molybdenum, tungsten, or titanium, a metallic nitride such as tantalum nitride or titanium nitride, or a metallic silicide such as titanium silicide, nickel suicide, cobalt silicide, tungsten silicide, erbium silicide, or platinum silicide, as examples. The gate electrode 310 may also be comprised of any combinations of the above-mentioned materials, for example.

At this stage, the doped source 304 and drain 306 regions are comprised of an ultra-thin silicon film 318. Next, the wafer 300, in particular, the mesa structure 319, is annealed, which results in the rearrangement of silicon atoms in the original source 304 and drain 306 regions. This rearrangement of silicon atoms may occur by surface migration of silicon atoms in the mesa structure 319 within the source region 304 and drain region 306, which is driven by the minimization of surface tension, during the anneal.

Figure 2E:
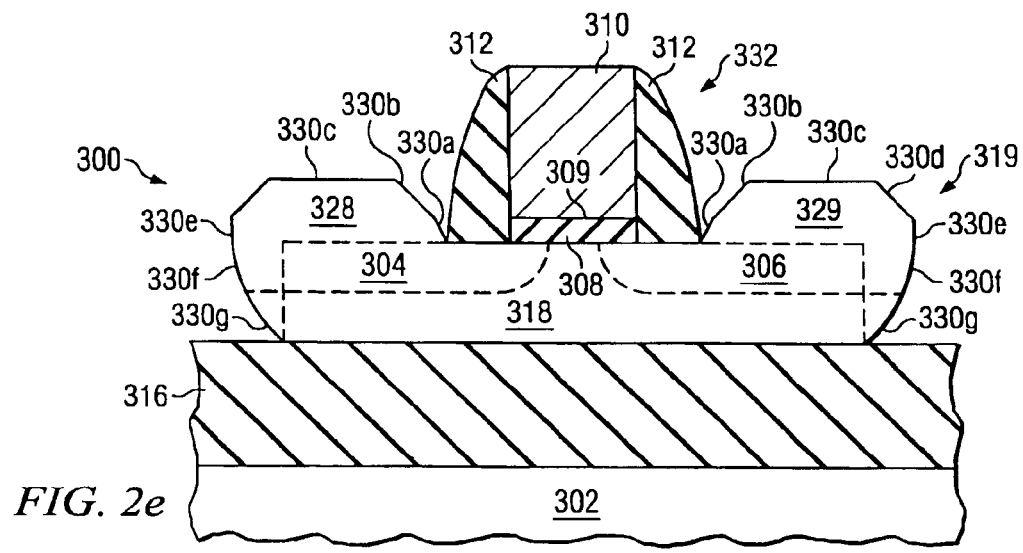

The anneal step results in the formation of the raised source and drain structures 328 and 329, as shown in FIG. 2e. In this embodiment, the anneal step is preferably performed after the source 304 and drain 306 regions have been doped. The resulting source region 304/328 includes the original source region 304 before the anneal step and the raised source region 328 that is formed during the anneal step. Similarly, the resulting drain region 306/329 includes the original drain region 306 before the anneal step and the raised drain region 329 that is formed during the anneal step. Preferably, the raised source and drain structures 328 and 329 have a height that is greater than and extends above a top surface 309 of the gate dielectric 308. Conductive materials such as metals or metallic suicides may subsequently be formed on the raised source 328 and drain 329 regions to further reduce the electrical resistance.

Figure 3A:
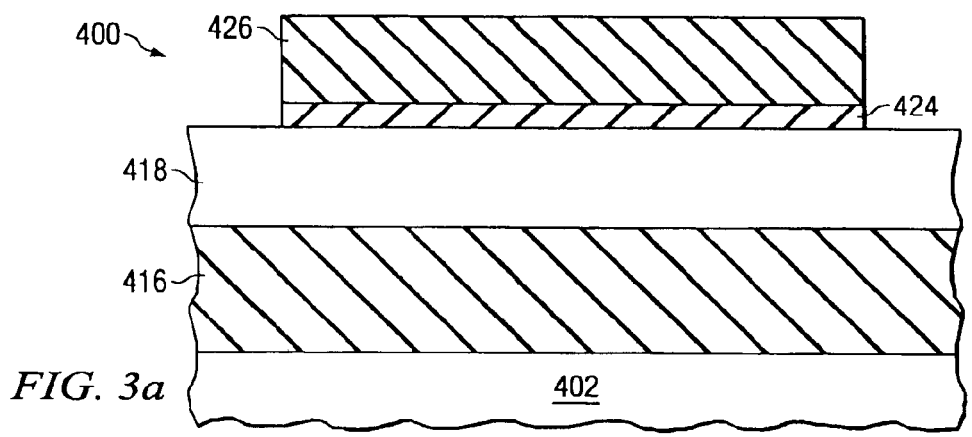
FIGS. 3a through 3e show cross-sectional views of another embodiment of the invention, wherein raised source and drain regions are formed prior to doping the source and drain region.
Figure 3B:
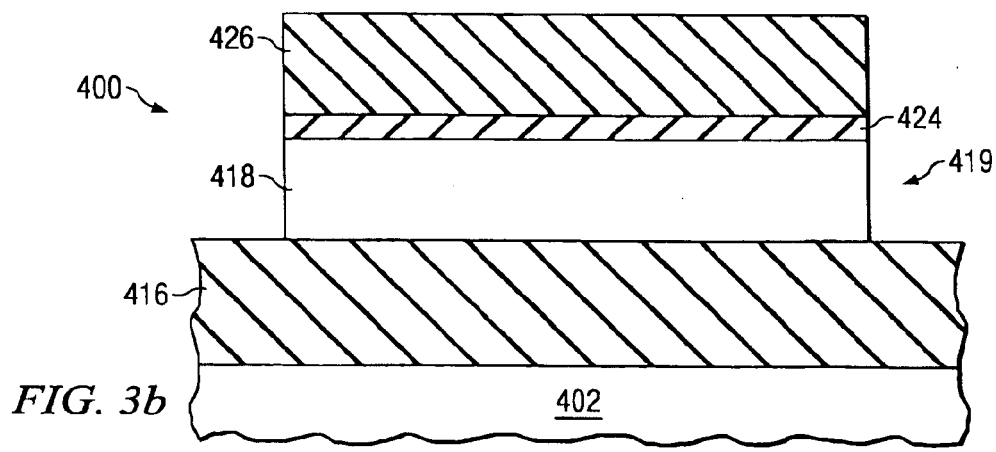
Figure 3C:
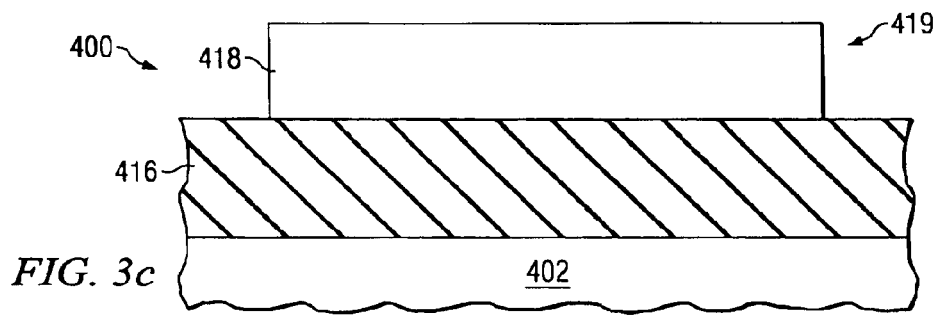

An another embodiment of the invention, to be described next with reference to FIGS. 3a–3e, the annealing process to form the raised structure is performed before the source 404 and drain 406 regions are doped. A wafer 400 comprising a semiconductor layer or film 418 over an insulator 416 is provided, and an active region mask 424/426 is formed over the semiconductor film 418, as shown in FIG. 3a. The semiconductor layer 418, which preferably comprises silicon, for example, is etched using the active region mask 424/426, as shown in FIG. 3b. After the etch step, the semiconductor layer 418 may comprise one or more mesa structures 419, for example (although only one mesa structure 419 is shown in each figure). The active region mask 424/426 is then removed, as shown in FIG. 3c.

Figure 3D:
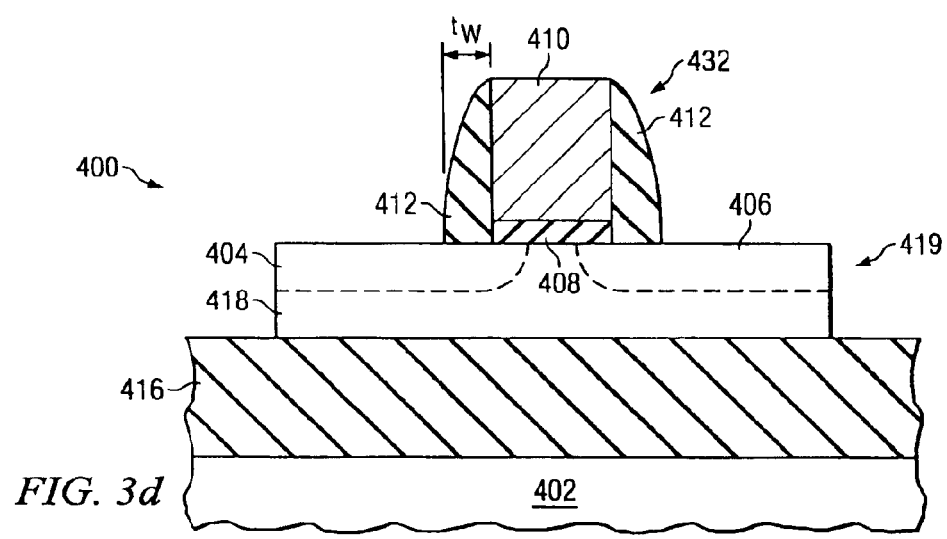

Portions of the transistor 432 are then formed, as shown in FIG. 3d. Forming the transistor 432 comprises forming the gate dielectric 408, the gate electrode 410 and spacers 412 adjacent the sides of the gate electrode 410, as shown in FIG. 3d. The gate electrode 410 may include a first side and a second side, with a spacer 412 adjacent each of the gate electrode 410 sides. The width $t_w$ of the spacers 412 may be 1000 Angstroms or less, for example, and more particularly, the width $t_w$ may range from about 5 Angstroms to 1000 Angstroms, for example. In this embodiment, at this stage, the source and drain regions 404 and 406 of the silicon film layer 418 have not yet been doped.

Figure 3E:
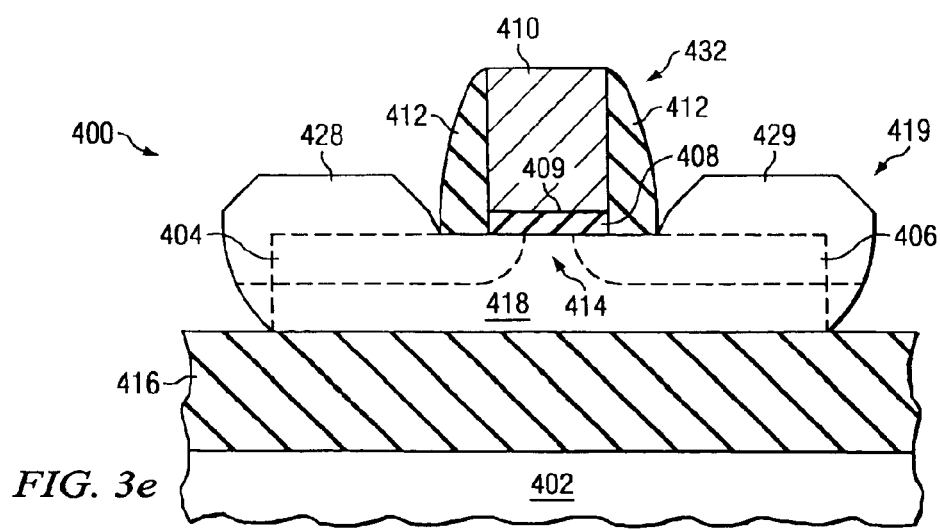

Next, the transistor 432 structure is annealed, which results in the rearrangement of silicon atoms in the undoped source and drain regions 404 and 406. This rearrangement of silicon atoms occurs by surface migration of silicon atoms in the mesa structure 419 within the source region and drain region 404 and 406, which is driven by the minimization of surface tension during the anneal. The anneal step results in the formation of the raised source and drain structures 428 and 429 disposed over the source and drain regions 404 and 406, respectively, within the semiconductor layer 418, as shown in FIG. 3e. In particular, preferably, the raised source and drain structures 428 and 429 have a height that is greater than and extends above a top surface 409 of the gate dielectric 408.

After the formation of the raised structures 428 and 429, the source 404/428 and drain 406/429 regions are then doped, by diffusion or implantation, as examples. By performing the annealing step before the doping step in this embodiment, the dopants experience a lower thermal cycle compared to the embodiment previously described herein with reference to FIGS. 2a through 2e. As a result, there is less lateral diffusion of the dopants from the source 404/428 and drain 406/429 regions into the channel region 414 (see FIG. 3e) in this embodiment, which is advantageous because fewer dopants in the channel region 414 enables the formation of smaller devices 432.

The anneal processes described herein may comprise a variety of gases, temperatures, pressures and times. For example, in one embodiment, the silicon atom (or other semiconductor atom of mesa structures 319 or 419) migration may be accomplished by annealing the ultra-thin source and drain regions 304, 306, 404, 406 at elevated temperatures in a gas ambient, such as hydrogen, for example. The temperature of the anneal process may range from 600 degrees C. to 1200 degrees C., as an example, and the anneal time may range from 1 second to 2 hours, for example. The partial pressure of the gas may range from $1 \times 10^{-9}$ Torr to 800 Torr, for example.

Alternatively, the ambient may also contain other gases in addition to hydrogen, such as a mixed gas ambient. For example, the gas ambient may comprise hydrogen and argon, or hydrogen and nitrogen. The gas ambient may alternatively comprise nitrogen, argon, hydrogen, or a combination thereof, as examples.

In another embodiment, the annealing process may be performed in vacuum with pressure ranging from $1 \times 10^{-10}$ Torr to $1 \times 10^{-3}$ Torr, for example. In yet another embodiment, the annealing process is performed in an inert ambient, e.g. in $N_2$ gas with pressures ranging from $1 \times 10^{-9}$ Torr to 800 Torr, for example. The annealing processes mentioned may be accomplished by techniques known and used in the art. The annealing process may be performed, for example, in a chemical vapor deposition (CVD) epitaxial reactor.

Figure 4:
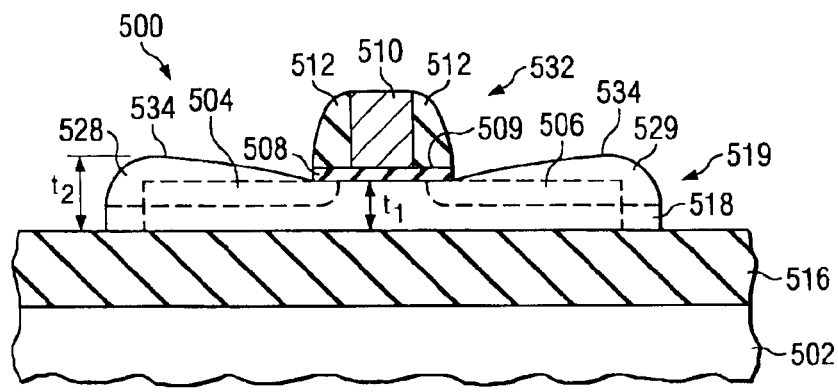
FIG. 4 shows an embodiment of the invention wherein the raised source and drain regions have a top surface that is curved.

The cross-sectional profile or shape of the raised source 328/428 and drain 329/429 regions formed using the method described in accordance with embodiments of the present invention is unique and different from prior art raised source and drain regions formed by conventional methods, such as selective epitaxy. The raised source and drain regions 222 formed using conventional selective epitaxial growth have planar top surfaces, as shown in FIG. 1c. In contrast, the raised source 328 and drain 329 regions formed by the migration of atoms in accordance with an embodiment of the present invention may have non-planar surfaces, as shown in FIG. 2e. The non-planar surface of the raised source 328 and drain 329 regions may be multi-faceted; that is, the raised source 328 and drain 329 regions may comprise several facets 330a, 330b, 330c, 330d, 330e, 330f, 330g, as shown, with each facet 330a, 330b, 330c, 330d, 330e, 330f, 330g, having a different angle with respect to the horizontal surface of the semiconductor material or silicon film 318, for example. Alternatively, the non-planar surfaces of the raised source 528 and drain 529 regions may comprise curved regions 534, as shown in FIG. 4. The selection of gases, temperature, time and pressure of the anneal step are factors that influence whether the raised regions are multi-faceted or are curved.

Note also that the anneal causes movement of the atoms in the semiconductor material 318, 418, and 518 not only upwardly in a direction perpendicular to the top surface of the wafer 100, 200, and 300, but also laterally, on the sides of mesas 319, 419 and 519, in a direction parallel to the wafer 100, 200, and 300 top surface. This phenomenon can be seen in FIGS. 2e, 3e and 4, for example.

In FIG. 4 the thickness $t_1$ of the original silicon film 518 may be compared to the increased resultant total thickness $t_2$ of the semiconductor material in the raised regions 528 and 529 after the anneal step. In FIG. 4, an ultra-thin silicon mesa 519 is formed on a silicon oxide insulator 516. The thickness $t_1$ of the silicon film 518 mesa structure 519 may be about 28 nm, for example. After a hydrogen anneal at about 900 degrees C. for about 2 minutes, silicon atoms along the edges of the silicon mesa 519 migrate to minimize surface tension, and form raised edges 528 and 529 having a thickness $t_2$ of about 45 nm, for example. Preferably, the raised source and drain structures 528 and 529 have a height or thickness $t_2$ that is greater than and extends above the top surface 509 of the gate dielectric 508.

Because the raised source and drain regions 528 and 529 are formed from the underlying semiconductor material 518 during the anneal process, the raised source region 528 and raised drain region 529 are integral to the semiconductor material 518. The semiconductor material 518 comprises a first thickness $t_1$, and the raised source region 528 and the raised drain region 529 comprise a second thickness $t_2$.

Preferably, the raised segment 528 and 529 thickness $t_2$ is between about 1.1 to 1.7 times greater than the original thickness $t_1$ of the semiconductor layer 518, and even more preferably, in one embodiment, the raised segment 528 and 529 thickness $t_2$ comprises at least 1.5 times the thickness of the semiconductor layer 518 thickness $t_1$, as examples.

Figure 5A:
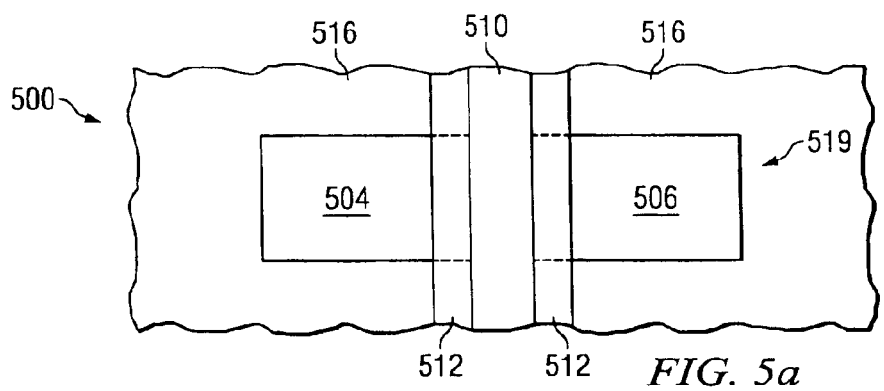
FIGS. 5a and 5b show a top view of the embodiment shown in FIGS. 3d and 3e, before and after annealing.
Figure 5B:
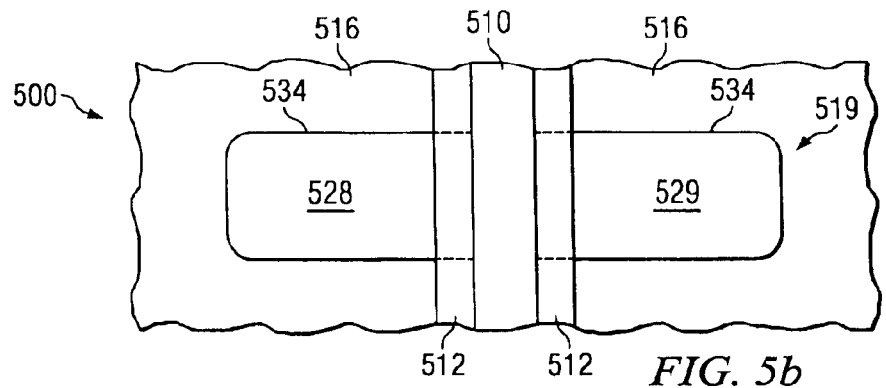

FIGS. 5a and 5b show a top view of the embodiment shown in FIG. 4, before and after annealing. FIG. 5a shows the top view of an ultra-thin body device 500, illustrating the source region 504, drain region 506, gate electrode 510, and the underlying insulator 516. After the migration of atoms in the ultra-thin source and drain regions 504 and 506 caused by the anneal, self-aligned raised source and drain regions 528 and 529 are formed, the top view of which is shown in FIG. 5b. The curved regions 534 of the raised source and drain regions 528/529 formed during the anneal step are shown in FIG. 5b.

In an embodiment of the invention, the method is not limited to the formation of a MOSFET or transistor device, although a transistor 332, 432, and 532 is shown by way of example in the figures. The method includes forming a semiconductor device (such as a transistor 332, comprising providing a SOI wafer 317 (FIG. 2a), the wafer 317 comprising a layer of semiconductor material 318 disposed over an insulating layer 316, patterning the semiconductor material 318 to form a mesa structure 319 (FIG. 2c), and forming a semiconductor device 332 within at least a portion of the mesa structure 319 (FIG. 2d), leaving a portion of the semiconductor material of the mesa structure exposed, such as the top surfaces of source region 304 and drain region 306. The mesa structure 319 is annealed at an elevated temperature to form at least one raised segment 328 and/or 329 on the exposed semiconductor material 304 and/or 306 of the mesa structure 318 (FIG. 2e).

Embodiments of the invention achieve technical advantages as a novel method for manufacturing a transistor having raised source and drain regions 328, 329, 428, 429, 528, and 529 by annealing the mesa structure 319/419/519 of the semiconductor film 318, 418, 518. Crystal defects in the semiconductor material 318, 418 and 518 are not introduced by the anneal, and excellent crystallinity is maintained in the raised source and drain regions 328, 329, 428, 429, 528, and 529. The method described herein provides a cost savings, because an epitaxy or deposition step is not required, as in the prior art. The increased thickness of the raised structure reduces the electrical resistance of the raised region. Raised structures may be formed even on very thin semiconductor films, e.g. less than 100 Angstroms, in accordance with embodiments of the invention, which is particularly advantageous in a MOSFET device formed on an SOI wafer or in a UTB application. Embodiments of the invention provide a wide process window for forming a raised source and drain 328, 329, 428, 429, 528, and 529 structure.

Embodiments of the present invention are not restricted to the migration of silicon atoms or silicon-on-insulator ultra-thin body devices. The novel technique described herein may be used to form raised segments or regions over any crystalline or amorphous semiconductor materials 318, 418 or 518, such as germanium, silicon germanium, gallium arsenide, and indium phosphide, overlying an insulator material, as examples. The insulator 316, 416, or 516 material may be, but not restricted to, silicon oxide, silicon nitride, or aluminum oxide. In the preferred embodiment, the semiconductor material 318, 418 or 518 comprises silicon and the insulator 316, 416, or 516 material comprises silicon oxide.

Although embodiments of the present invention and their advantages have been described in detail, it should be understood that various changes, substitutions and alterations can be made herein without departing from the spirit and scope of embodiments of the invention as defined by the appended claims. For example, it will be readily understood by those skilled in the art that the materials, processes and manufacturing steps may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, comprising:

providing a wafer, the wafer comprising a layer of semiconductor material disposed over an insulating layer;

patterning the semiconductor material to form a mesa structure;

forming the semiconductor device within at least a portion of the mesa structure, leaving a portion of the semiconductor material of the mesa structure exposed; and annealing the mesa structure at an elevated temperature to form at least on raised segment on the exposed semiconductor material of the mesa structure.

2. The method according to claim 1, wherein annealing the mesa structure comprises heating the semiconductor device in a vacuum or in a gas ambient.

3. The method according to claim 1 wherein the semiconductor material comprises silicon, germanium, a compound semiconductor, or combinations thereof.

4. The method according to claim 1 wherein the mesa structure has a thickness of 500 Angstroms or less.

5. The method according to claim 1 wherein the insulating layer comprises silicon oxide.

6. The method according to claim 1 wherein annealing the mesa structure comprises elevating the temperature to about 600 degrees C. to 1200 degrees C., wherein annealing the mesa structure comprises a length of time ranging from 1 second to 2 hours.

7. The method according to claim 1, further comprising doping at least a portion of the mesa structure, before annealing the mesa structure.

8. The method according to claim 1, further comprising doping the at least one raised segment.

9. The method according to claim 1, wherein annealing the mesa structure comprises exposing the mesa structure to a gas ambient comprising hydrogen.

10. The method according to claim 9 wherein the gas pressure is between approximately $10^{-9}$ Torr to 800 Torr.

11. The method according to claim 1 wherein annealing the mesa structure comprises exposing the mesa structure to a gas ambient comprising nitrogen, argon, hydrogen, or a combination thereof.

12. The method according to claim 1 wherein annealing the mesa structure comprises exposing the mesa structure to a gas ambient, wherein the gas ambient is a gas mixture comprising of two or more gas species.

13. The method according to claim 1, wherein annealing the mesa structure comprises forming at least one raised segment comprising a non-planar top surface.

14. The method according to claim 13, wherein the at least one raised segment non-planar top surface comprises a curved surface or a multi-faceted surface.

15. The method according to claim 1, wherein forming the semiconductor device comprises forming a MOSFET including a source region and a drain region, wherein the at least one raised segment formed is disposed over the MOSFET source and/or drain region.

16. The method according to claim 15, wherein forming the semiconductor device further comprises:
   forming a gate dielectric over the mesa structure over at least a portion of the source and drain regions, the gate dielectric having a top surface; and
   forming a gate electrode over the gate oxide, wherein annealing the mesa structure to form at least one raised segment comprises forming a raised source region over the MOSFET source region and forming a raised drain region over the MOSFET drain region, wherein the raised source region and raised drain region have a height greater than and extending above the top surface of the gate dielectric.

17. The method according to claim 16, wherein forming the gate electrode comprises forming a gate electrode comprising a semiconductor material or a conductor, and wherein forming the gate dielectric comprises forming a gate dielectric comprising silicon oxide, silicon oxynitride, or a high permittivity material.

18. The method according to claim 17, wherein forming the gate dielectric comprises forming a gate dielectric comprising a high permittivity material, wherein the high permittivity material comprises hafnium oxide, hafnium oxynitride, hafnium silicate, zirconium oxide, zirconium silicate, aluminum oxide, or lanthanum oxide, or combinations thereof.

19. The method according to claim 1, wherein providing the wafer comprises providing a silicon-on-insulator (SOI) wafer, the SOI wafer comprising a substrate, the insulating layer being disposed over the substrate, and wherein the layer of semiconductor material is disposed over the insulating layer.

20. The method according to claim 19, wherein providing the SOI wafer comprises providing an SOI wafer having an insulating layer comprising silicon oxide.

21. A method of forming a semiconductor device, comprising:
   providing a wafer, the wafer comprising a layer of semiconductor material disposed over an insulating layer;
   patterning the semiconductor material to form a mesa structure;
   forming a gate dielectric over a portion of the mesa structure;
   forming a gate electrode over the gate dielectric, the gate electrode comprising two or more sides;
   forming spacers adjacent the sides of the gate electrode; and
   annealing the mesa structure at an elevated temperature to form raised segments on the mesa structure adjacent the spacers.

22. The method according to claim 21, further comprising doping the raised segments, after annealing the mesa structure.

23. The method according to claim 21, further comprising doping portions of the mesa structure adjacent gate electrode to form source and drain regions of a transistor, before annealing the mesa structure.

24. The method according to claim 21, wherein annealing the mesa structure comprises heating the semiconductor device in a vacuum or in a gas ambient.

25. The method according to claim 21 wherein the semiconductor layer comprises silicon, germanium, silicon germanium, gallium arsenide, indium phosphide, a compound semiconductor, or combinations thereof.

26. The method according to claim 21 wherein the mesa structure has a thickness of 500 Angstroms or less.

27. The method according to claim 21 wherein the insulating layer comprises silicon oxide.

28. The method according to claim 21 wherein annealing the mesa structure comprises elevating the temperature to about 600 deg C. to 1200 deg. C.

29. The method according to claim 21 wherein annealing the mesa structure comprises a length of time ranging from 1 second to 2 hours.

30. The method according to claim 21 wherein the gas pressure is between approximately $10^{-9}$ Torr to 800 Torr.

31. The method according to claim 21 wherein annealing the mesa structure comprises exposing the mesa structure to a gas ambient comprising nitrogen, argon, hydrogen, or a combination thereof.

32. The method according to claim 21 wherein annealing the mesa structure comprises exposing the mesa structure to a gas ambient, wherein the gas ambient is a gas mixture comprising of two or more gas species.

33. The method according to claim 21, wherein the at least one raised segment comprises a non-planar top surface.

34. The method according to claim 33, wherein the at least one raised segment non-planar top surface comprises a curved surface or a multi-faceted surface.

35. The method according to claim 21, wherein forming the gate electrode comprises forming a gate electrode comprising a semiconductor material or a conductor.

36. The method according to claim 21, wherein forming the gate dielectric comprises forming a gate dielectric comprising silicon oxide, silicon oxynitride, or a high permittivity material.

37. The method according to claim 21, wherein forming the gate dielectric comprises forming a gate dielectric comprising a high permittivity material, wherein the high permittivity material comprises hafnium oxide, hafnium oxynitride, hafnium silicate, zirconium oxide, zirconium silicate, aluminum oxide, or lanthanum oxide, or combinations thereof.

38. The method according to claim 21, wherein forming spacers comprises forming spacers comprising of a dielectric.

39. The method according to claim 38, wherein forming spacers comprises forming spacers comprising of silicon oxide, silicon oxynitride, or silicon nitride, or combinations thereof.

40. The method according to claim 21, wherein providing the wafer comprises providing a silicon-on-insulator (SOI) wafer, the SOI wafer comprising a substrate, the insulating layer being disposed over the substrate, and wherein the layer of semiconductor material is disposed over the insulating layer.

* * * * *

UNITED STATES PATENT AND TRADEMARK OFFICE
CERTIFICATE OF CORRECTION

PATENT NO. : 6,872,606 B2
DATED : March 29, 2005
INVENTOR(S) : Chen et al.

It is certified that error appears in the above-identified patent and that said Letters Patent is hereby corrected as shown below:

<u>Column 10,</u>
Line 35, delete the first occurrence of "on" and insert -- one --

Signed and Sealed this

Fifth Day of July, 2005

JON W. DUDAS
*Director of the United States Patent and Trademark Office*